(12) United States Patent
Wang et al.

(10) Patent No.: US 11,339,501 B2
(45) Date of Patent: May 24, 2022

(54) METHOD FOR PREPARING LARGE-AREA TRANSITION METAL DICHALCOGENIDE SINGLE-CRYSTAL FILMS BY PERFORMING VAPOR DEPOSITION ON A SINGLE-CRYSTAL C-PLANE SAPPHIRE SUBSTRATE WITH <10-10> SURFACE STEPS

(71) Applicant: NANJING UNIVERSITY, Nanjing (CN)

(72) Inventors: Xinran Wang, Nanjing (CN); Taotao Li, Nanjing (CN); Yi Shi, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 17/000,196

(22) Filed: Aug. 21, 2020

(65) Prior Publication Data

US 2020/0385888 A1  Dec. 10, 2020

(30) Foreign Application Priority Data

Jun. 29, 2020  (CN) .......................... 202010602134.6

(51) Int. Cl.
*C30B 25/18* (2006.01)
*C30B 29/46* (2006.01)
*C30B 23/02* (2006.01)

(52) U.S. Cl.
CPC .............. *C30B 29/46* (2013.01); *C30B 25/18* (2013.01); *C30B 23/025* (2013.01)

(58) Field of Classification Search
CPC ....... C30B 23/00; C30B 23/02; C30B 23/025; C30B 25/00; C30B 25/02; C30B 25/18; C30B 25/186; C30B 29/00; C30B 29/10; C30B 29/46; C23C 16/02; C23C 16/22; C23C 16/305; C23C 14/02; C23C 14/06; C23C 14/0623
USPC ....... 117/81, 84, 88, 94, 101, 103–104, 106, 117/937, 956
See application file for complete search history.

(56) References Cited

PUBLICATIONS

Dumcenco, et al. publication entitled "Large-area epitaxial monolayer MoS2," ACS Nano, vol. 9, No. 4, pp. 4611-4620 (2015). (Year: 2015).*

(Continued)

*Primary Examiner* — Kenneth A Bratland, Jr.
(74) *Attorney, Agent, or Firm* — CBM Patent Consulting, LLC

(57) ABSTRACT

The present invention discloses a method for preparing large-area transition metal dichalcogenide (TMDC) single-crystal films and the products obtained therefrom. The method comprises the steps of: (1) providing a single-crystal C-plane sapphire with surface steps along <10$\overline{1}$0> directions; and (2) taking the sapphire in step (1) as the substrate, generating unidirectionally arranged TMDC domains on the sapphire surface based on a vapor deposition method and keeping the domains continuously grow and merge into a large-area single-crystal film. The lateral size of the TMDC single-crystal films prepared by the method can reach inch level or above, and is limited only by the size of the substrate.

4 Claims, 7 Drawing Sheets

(56) References Cited

PUBLICATIONS

Shen, et al. publication entitled "Surface step morphologies of GaN films grown on vicinial sapphire (0001) substrates by rf-MBE," Journal of Crystal Growth, vol. 300, pp. 75-78 (2007). (Year: 2007).*

Ji, et al. publication entitled "Unravelling orientation distribution and merging behavior of monolayer MoS2 domains on sapphire," Nano Letters, vol. 15, pp. 198-205 (2015). (Year: 2015).*

* cited by examiner

METHOD FOR PREPARING LARGE-AREA TRANSITION METAL DICHALCOGENIDE SINGLE-CRYSTAL FILMS BY PERFORMING VAPOR DEPOSITION ON A SINGLE-CRYSTAL C-PLANE SAPPHIRE SUBSTRATE WITH <10-10> SURFACE STEPS

This application claims priority to Chinese Patent Application Ser. No. CN202010602134.6 filed on 29 Jun. 2020.

TECHNICAL FIELD

The present invention relates to a method for preparing large-area transition metal dichalcogenide single-crystal films and the products obtained therefrom, belonging to the field of electronic materials.

BACKGROUND ART

Transition metal dichalcogenides (TMDCs) are a group of typical two-dimensional semiconductor materials with atomic thickness and excellent physical and chemical properties, such as band gap in the visible range and high carrier mobility. They are potentially very useful in many fields such as photodetectors, field-effect transistors and integrated circuits. The stable and controllable preparation of large-area single-crystal films with inch-level size or above is the key to the integration and applications.

The current methods for preparing device-level TMDC materials include mechanical exfoliation method, molecular number epitaxy (MBE), chemical vapor deposition (CVD), and the like. Wherein, the mechanical exfoliation method produces high-quality TMDC flakes, but large-area films with uniform thickness cannot be obtained, failing to meet the requirement of device integration. The MBE method produces high-quality crystals but requires ultra-high vacuum and complicated system, which hinders its application in the industrial production.

The CVD methods utilize gaseous sources to react at a high temperature, producing TMDC single-crystal domains which finally merge into large-area continuous polycrystalline films on a substrate surface. The substrate plays a key role in determining the orientations of the TMDC domains. For example, on the amorphous substrates such as $SiO_2/Si$ and quartz, the TMDC domains are randomly aligned, while on the $C_6$-symmetric substrates such as h-BN, mica and C-sapphire, TMDC domains are arranged in two opposite directions with a 180° mirror angle with respect to each other. These randomly arranged or 180° antiparallel TMDC domains, will form grain boundaries when merging into a continuous film. In the electronic applications, these grain boundaries will cause serious electron scattering and greatly undermines the device performance. Therefore, eliminating grain boundaries and obtaining large-area (inch scale) TMDC single-crystal films are the key technical bottlenecks in the field.

Finding a suitable substrate which enables the unidirectional alignment of TMDC domains is the key to grow single-crystal TMDC films. As above mentioned, C-plane Sapphire has a $C_6$ symmetry and been widely used as the substrate for the III-IV semiconductor epitaxy due to its chemical and thermal stability and lattice matching. The C-sapphire substrate for III-IV semiconductors is designed with a major mis-cut angle towards M-axis (<10$\bar{1}$0> directions) of the substrate, which produces surface steps along A-axis (<11$\bar{2}$0> directions) (denoted as C/M sapphire). In this invention, the C-sapphire substrate for TMDCs is designed with a major mis-cut angle toward <11$\bar{2}$0> directions and therefore steps along <10$\bar{1}$0> directions (denoted as C/A sapphire). The step orientation is the only difference between the two C-sapphire substrates.

SUMMARY OF THE INVENTION

Object of the invention: the present invention provides a method for preparing large-area TMDC single-crystal films, aiming to solving the problems that the size of the TMDC single crystal prepared by the existing method is too small to meet the integrated application of devices, or only large-area polycrystalline films can be obtained, and the performance of the device is deteriorated by grain boundaries.

Technical solution: the present invention discloses a method for preparing large-area TMDC single-crystal films, comprising the steps of:

(1) providing a single-crystal C-plane sapphire with <10$\bar{1}$0> steps on the surface (which is perpendicular to that of the commonly used C-plane sapphire substrates); and (2) taking the sapphire in step (1) as a substrate, generating unidirectionally arranged TMDC domains on the surface using vapor deposition method and keeping the domains grow and merge into a large-area single-crystal continuous film.

Wherein, the TMDC single crystals involved in the method can be molybdenum disulfide, tungsten disulfide, molybdenum diselenide, tungsten diselenide, and the like.

The <10$\bar{1}$0> steps can be obtained by a major mis-cut towards <11$\bar{2}$0> crystallographic axis during machining process. In practice, there would exist a minor mis-cut towards M-axis (<10$\bar{1}$0>), which leads to a deviation of the step orientation from the ideal <10$\bar{1}$0> axis. It is ensured that the minor mis-cut angle ($\alpha_M$) should be less than 34.6% of the major mis-cut angle ($\alpha_A$). Under this circumstance, the surface steps slanted from the <10$\bar{1}$0> directions with within ±19.1°.

Preferably, $\alpha_M$ does not exceed 20% of $\alpha_A$; accordingly, the step direction deviates from <10$\bar{1}$0> with an allowable angular of ±11°.

The vapor deposition method adopted in step (2) can be a chemical vapor deposition method, a molecular beam epitaxy method, a pulse laser deposition method, a magnetron sputtering method and the like.

Wherein, the process for preparing the TMDC single crystals by chemical vapor deposition methods comprises the steps of: placing the sapphire substrate in a deposition chamber, loading growth sources, setting a growth condition, and generating unidirectionally arranged TMDC domains on the sapphire substrate surface; and continuously introducing the growth sources to make the TMDC domains gradually grow and merge into a large-area TMDC single-crystal film.

Taking $MoS_2$ as an example, of which the growth sources comprise a Mo source and a S source, wherein the Mo source and the S source can be in a gaseous or liquid/solid state which can be gasified by means of evaporation, volatilization and the like. The Mo source can be selected from $MoO_3$, $MoO_2$, $Mo(CO)_6$, inorganic salts of Mo, organic salts of Mo, elemental Mo and the like. The S source can be selected from S element vapor, $H_2S$ gas and the like. The Mo source and the S source react at a temperature of 750-1100° C. to generate $MoS_2$ crystals on the surface of the sapphire substrate.

The lateral size of the TMDC single-crystal films obtained by the method reaches inch level or above.

Principle of the present invention: TMDCs are $C_3$ symmetric crystals and C-sapphire has a $C_6$ symmetry. The epitaxy of TMDCs on the surface of C-plane sapphire (regardless of the influence of steps) has two energy-equivalent epitaxial configurations, so that the TMDC domains form anti-parallel domains with equal probability, which finally result in a large number of twin boundaries. When atomic steps exist on the surface, they promote the nucleation of TMDCs. By designing the atomic step direction, the nucleation energy of one direction can be lower than that of the other in the nucleation stage, and therefore only single orientated TMDC domains can be generated. The surface step direction of commonly used C-plane sapphire substrate in the industry is along <11$\bar{2}$0> orientation, i.e. the A-axis of sapphire. The steps along this direction have equal nucleation energy of antiparallel TMDC domains and produce antiparallel domains with equal probability, and finally merge into polycrystalline TMDC films.

According to the present invention, by changing the surface step to the <10$\bar{1}$0> direction, namely the M-axis of sapphire, only one crystal orientation is promoted, and nucleation in the opposite direction is inhibited. When the domains finally merge into a continuous film, it is of single crystalline nature with size greater than inch scale.

The beneficial effects are as follows: compared with the prior art, the present invention has the advantages that: (1) large-area continuous TMDC single-crystal films can be epitaxially grown on the industrial sapphire substrate, and the lateral size of the prepared TMDC single crystals reaches up to several inches, completely meeting the requirements of electronic devices and integrated circuits; (2) meanwhile, the obtained TMDC single-crystal films have no grain boundaries, with highly uniform device performance; and (3) the preparation method is compatible with industrial process, capable of realizing large-scale batch production, and free of metal contamination problems existed in the case of noble metal substrates, and can be popularized and applied in the microelectronics and optoelectronics industries.

DETAILED DESCRIPTION OF THE INVENTION

Figure 1:
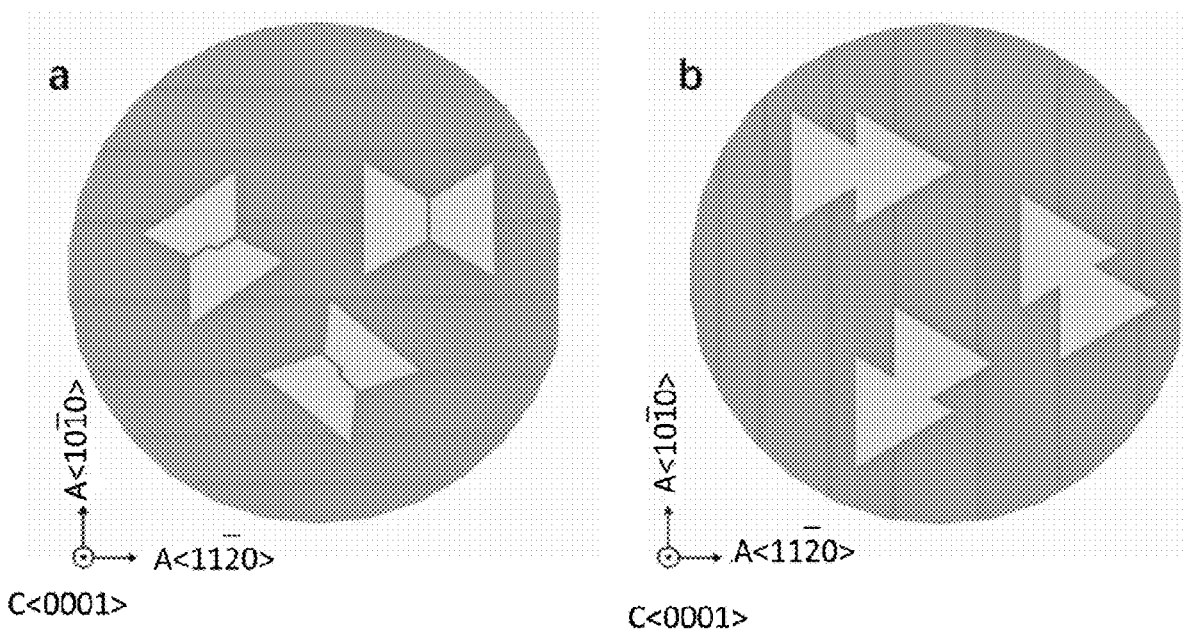
FIG. 1 is a schematic of the step orientation on C/M sapphire and C/A sapphire and the corresponding epitaxial TMDC domains on both substrate.

The technical solution of the present invention will be further described with reference to the accompanying drawings.

The preparation method can be used for preparing TMDC single crystals such as molybdenum disulfide, tungsten disulfide, molybdenum diselenide, tungsten diselenide and the like. By changing the direction of the surface steps of common C-sapphire in the industry, the specific step direction can induce TMDC domains to form single-directional alignment, finally realizing accurate atomic-level stitching, and producing the large-area single-crystal TMDC films.

The lateral crystal size of the prepared TMDC single-crystal films is limited only by the size of the substrate, for example, by using a 2-inch sapphire substrate, a 2-inch TMDC single crystal can be prepared.

The method specifically comprises the steps of:

(1) Providing a C-plane sapphire single crystal with surface atomic-level steps directed along <10$\bar{1}$0> direction. Due to an unavoidable minor mis-cut towards <10$\bar{1}$0> orientation in the actual machining process, the final step direction is likely to deviate from the ideal <10$\bar{1}$0> direction. Through experimental and calculation, the maximum allowable angular deviation is ±19.1°.

The machining of sapphire needs to first drill out an ingot from a larger cylinder, and then cut it into pieces. It is ensured that, during the whole machining process, the C-plane of the sapphire inclines towards the A-axis direction, and the M-direction does not incline, so that the sapphire wafer with the specific step direction in step (1) can be obtained. In practice, due to machining errors, there could be a minor mis-cut angle along the M-axis ($\alpha_M$) besides the major mis-cut angle along the A-axis ($\alpha_A$). It is ensured that $\alpha_M$ shall not be more than 34.6% of $\alpha_A$. For example, the processing design value is that the $\alpha_A$=0.2 deg, and $\alpha_M$=0 deg. The measured result after processing shows that $\alpha_A$=0.2 deg, and $\alpha_M$=0.04 deg. 0.04/0.2 is 20% less than 34.6%, in an acceptable range. The arctan 0.346 is approximately equal to 19.1°, which is a threshold deviation.

(2) Taking the sapphire single crystal cut in step (1) as a substrate, based on a vapor deposition method, such as a chemical vapor deposition method, a molecular beam epitaxy method, a pulse laser deposition method, a magnetron sputtering method and the like. Unidirectionally arranged TMDC domains are generated on the sapphire surface, and along with the reaction, the domains grow gradually and merge into a large-area TMDC single-crystal film.

The process for preparing the TMDC crystals by adopting the chemical vapor deposition method comprises the steps of: placing the C/A sapphire substrate in a vapor deposition chamber, loading the TMDC growth sources, setting a growth condition, and generating unidirectionally arranged TMDC domains on the surface; and continuously introducing the growth sources to allow the TMDC domains to gradually grow and merge into a large-area TMDC single-crystal film.

Example 1

Sulfur powder (S), molybdenum trioxide ($MoO_3$), and a sapphire (C-plane, A-direction inclined 0.2 degrees, M-direction inclined 0°) substrate were placed in a first, second and third temperature zones of the three-temperature zone CVD system, respectively. Vacuum was drawn below 10 Pa and 100 standard milliliters per minute (sccm) of Ar was introduced. The substrate was warmed to 850° C., then S was heated to 150° C. to melt, then $MoO_3$ was warmed to 530° C., and 5 sccm of oxygen was introduced. The oxygen was turned off after 30 minutes of reaction, and the $MoO_3$ source was removed from the heating zone. The substrate was cooled to 300° C. in an Ar and S atmosphere and S heating was stopped. Followed by continue cooling to room temperature and the sample was removed.

The optical micrograph is shown in FIG. 1, showing single arranged $MoS_2$ triangular grains.

Figure 2:
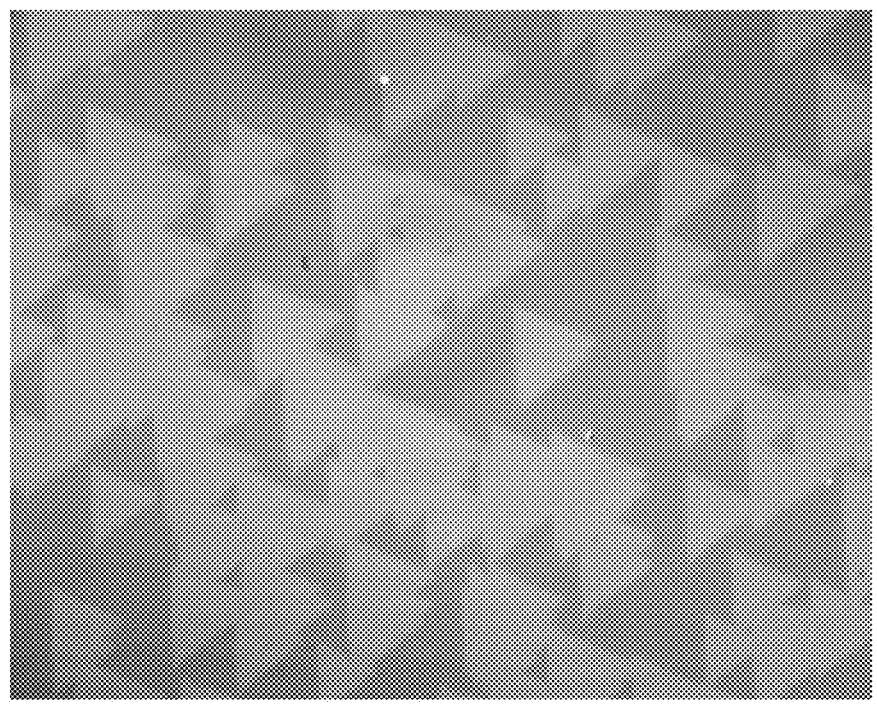
FIG. 2 is a photomicrograph of unidirectionally arranged molybdenum disulfide domains in Example 1.

Referring again to FIG. 2, SHG mapping of $MoS_2$ grains arranged in the same direction shows that the strength of the interior of the two grains and their junction region is uniform, indicating that no grain boundaries exist.

Figure 3:
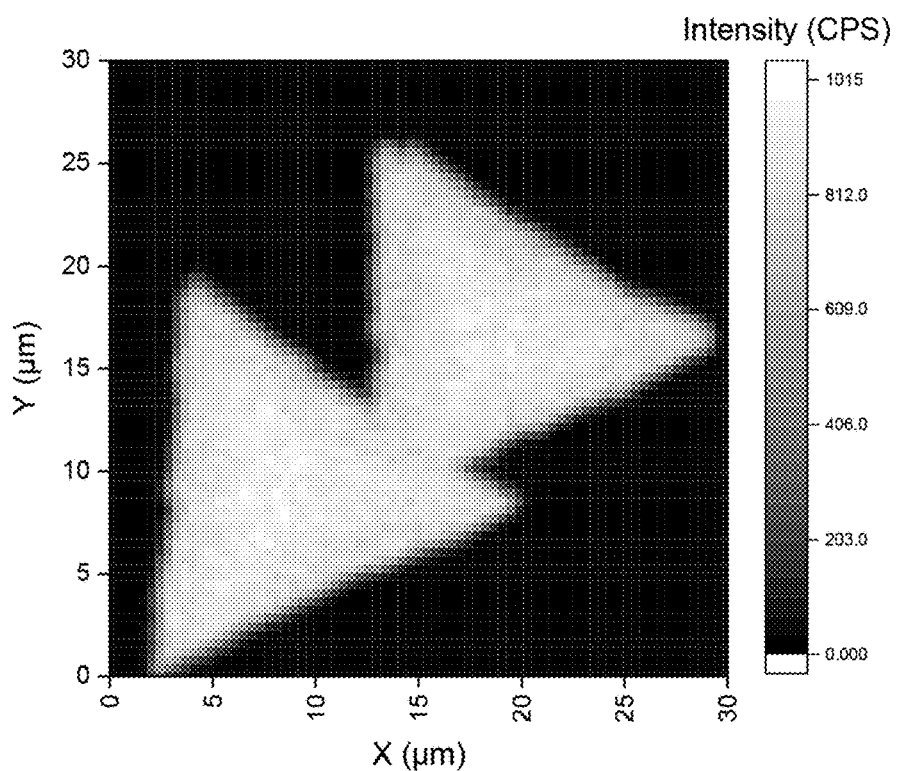
FIG. 3 is an SHG mapping of the unidirectional seamlessly-stitched molybdenum disulfide domains in Example 1.

In the region where two $MoS_2$ grains in the same direction merge, high-resolution imaging was carried out, and FIG. 3 is a high-resolution transmission electron microscope characterization of the sample, it can be seen that all the atoms are arranged in the same order from the inside of the grains on the two sides to the boundary region, no obvious distortion of the atomic direction is observed, nor 180° inversion of the atomic arrangement direction is observed, indicating that the grains arranged in the same direction can realize accurate atomic-level splicing, and merge into a complete large single crystal.

Example 2

Sulfur powder (S), metallic molybdenum (Mo), and 2-inch sapphire substrate (C-plane, A-direction inclined 1 degree, M-direction inclined 0.05 degrees) were placed in the first, second and third temperature zones of the three-temperature zone CVD system, respectively. Vacuum was drawn below 10 Pa and 100 standard milliliters per minute (sccm) of Ar was introduced. The substrate was warmed to 900° C., then S was heated to 150° C. to melt, then Mo was warmed to 650° C., and 5 sccm of oxygen was introduced. The oxygen was turned off after 60 min of reaction. The substrate was cooled to 300° C. in an Ar and S atmosphere and S heating was stopped. Followed by continuously cooling to room temperature, and the sample was taken to obtain the continuously covered $MoS_2$ single crystal 2-inch wafer.

Figure 4:
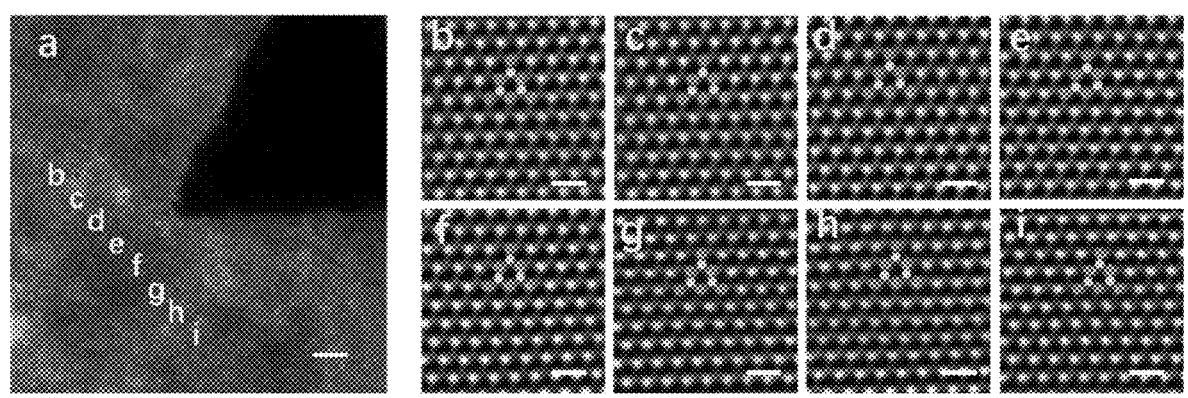
FIG. 4 is a TEM image of the unidirectionally arranged molybdenum disulfide grains in Example 1.
Figure 5:
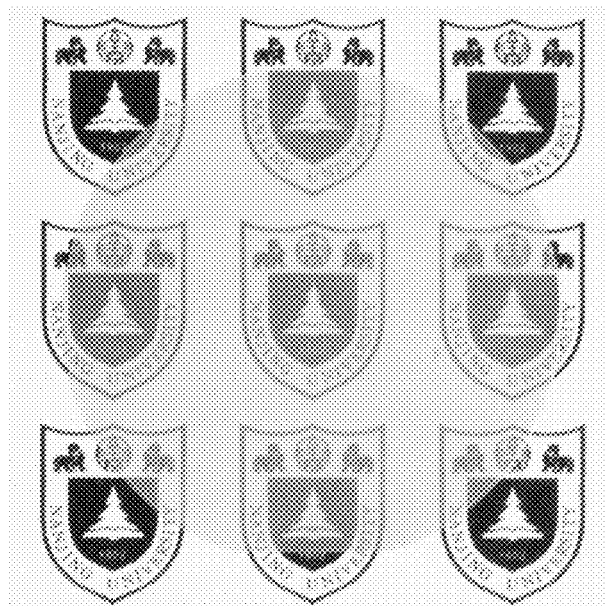
FIG. 5 is a photograph of a wafer-level molybdenum disulfide single-crystal film grown in Example 2.
Figure 6:
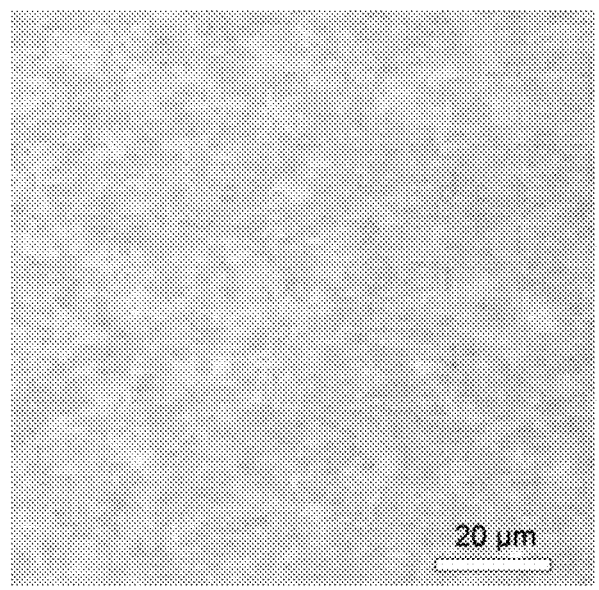
FIG. 6 is an SHG mapping at any position of the wafer-level molybdenum disulfide single-crystal film grown in Example 2.
Figure 7:
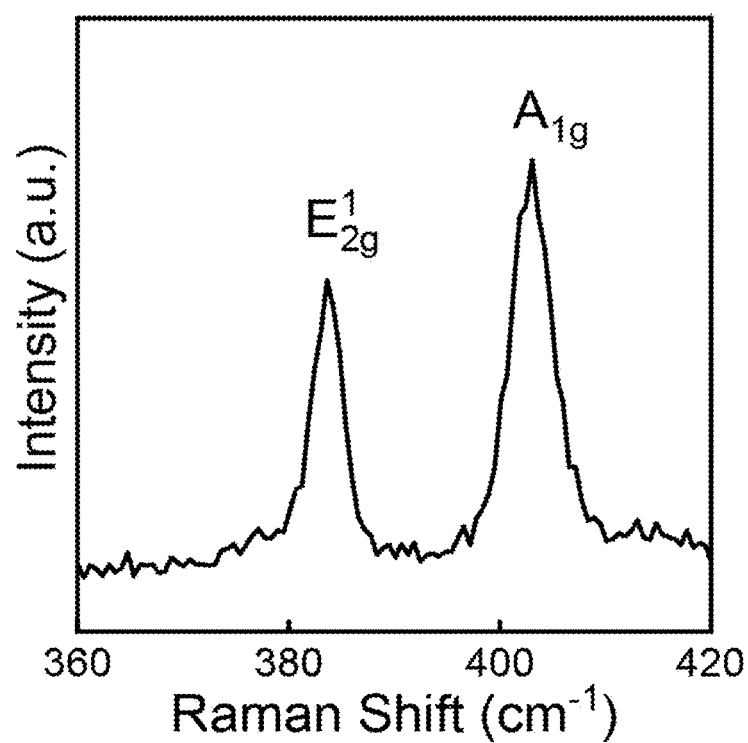
FIG. 7 is a Raman spectrum of the molybdenum disulfide single crystal grown in Example 2.

The physical photograph of the 2-inch single crystal sample is shown in FIG. 4. At any position of the sample, the SHG scanning test was used, as in FIG. 5, with no grain boundaries exist. FIGS. 6-7 are Raman and photoluminescence spectra, respectively, of the single crystal sample, from which it can be seen that the resulting sample is a monolayer of $MoS_2$.

Figure 8:
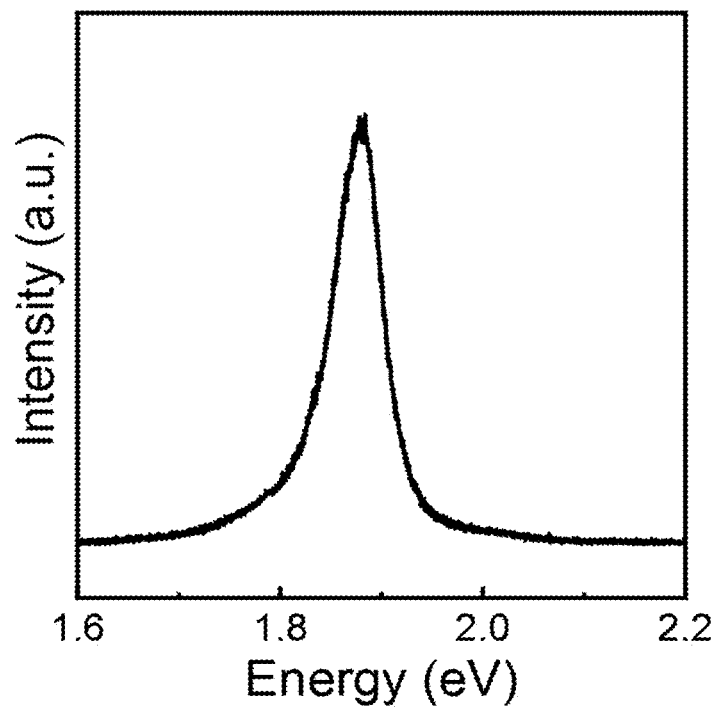
FIG. 8 is a photoluminescence spectrum of the molybdenum disulfide single crystal grown in Example 2.

The $MoS_2$ crystal was grown on a common sapphire substrate using the same process as in the present example, and the SHG scanning pattern of the obtained sample is shown in FIG. 8. It can be seen that a $MoS_2$ polycrystalline film is grown on the common sapphire substrate, and there is an obvious grain boundary.

Example 3

Sulfur powder (S), molybdenum trioxide ($MoO_3$), and a sapphire substrate (C-plane, A-direction inclined 0.2 degrees, M-direction inclined 0.04 degrees, step deviation $<10\bar{1}0>$ direction 11 degrees) were placed in the first, second and third temperature zones of the three-temperature zone CVD system, respectively. Vacuum was drawn below 10 Pa and 100 standard milliliters per minute (sccm) of Ar was introduced. The substrate was warmed to 930° C., then S was heated to 160° C. to melt, then $MoO_3$ was warmed to 530° C., and 3 sccm of oxygen was introduced. After 30 minutes of reaction, the oxygen was turned off and the $MoO_3$ source was removed from the heating zone. The substrate was cooled to 300° C. in an Ar and S atmosphere and S heating was stopped. Followed by continue cooling to room temperature and the sample was removed.

Figure 9:
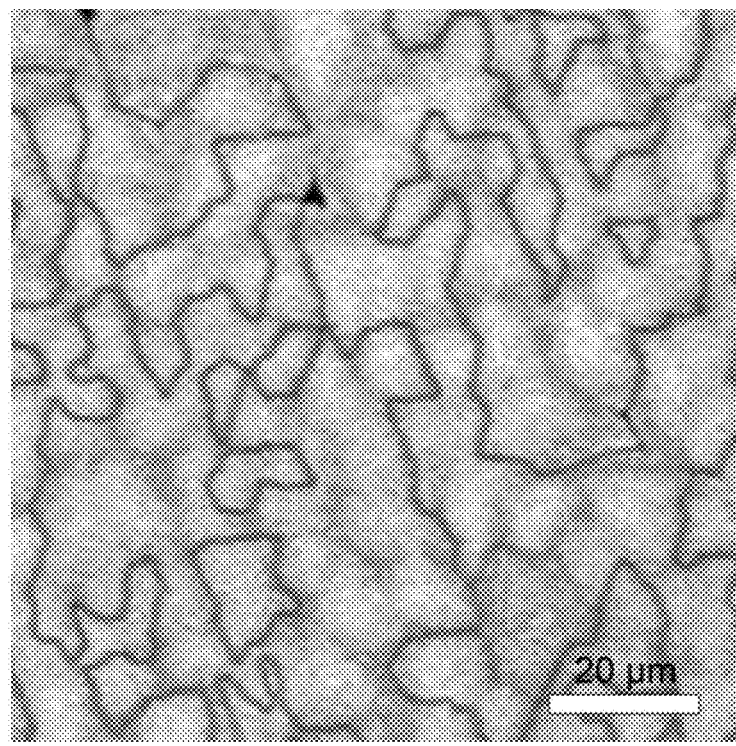
FIG. 9 is an SHG mapping image of a polycrystalline $MoS_2$ film grown on a C/M sapphire substrate in Example 2.
Figure 10:
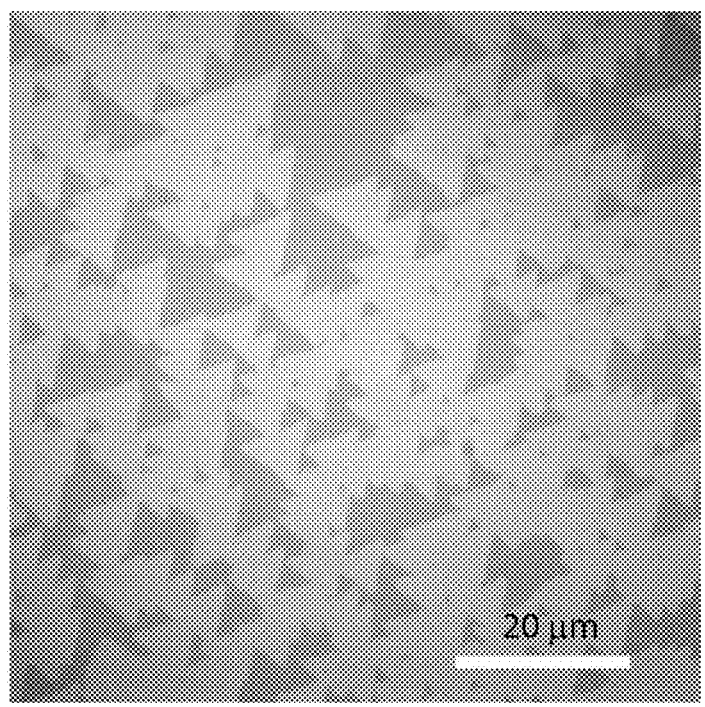
FIG. 10 is an optical photograph of an unidirectionally arranged $MoS_2$ grown in Example 3.
Figure 11:
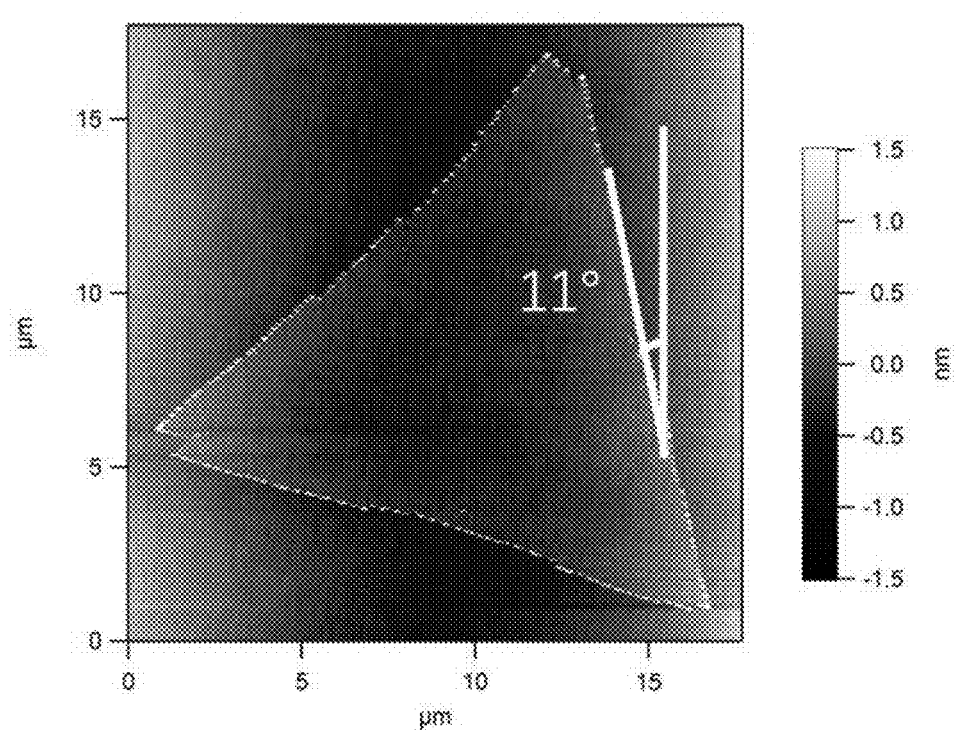
FIG. 11 is an atomic force microscope image of the unidirectional $MoS_2$ domains grown in Example 3.

FIG. 9 is an optical photograph of the unidirectionally arranged $MoS_2$ obtained in this example. FIG. 10 is a corresponding atomic force microscope image. It can be seen that although the steps deviate by 11 degrees, $MoS_2$ remains well unidirectional.

Example 4

Sulfur powder (S), tungsten trioxide ($WO_3$) and a sapphire substrate (C plane, A direction inclined 0.5 degrees) were placed in the first, second and third temperature zones of the three-temperature zone CVD system, respectively. Vacuum was drawn below 10 Pa and 100 sccm Ar+10 sccm $H_2$ were introduced. The substrate was warmed to 850° C., then S was heated to 150° C. to melt, then $WO_3$ was warmed to 1050° C. to start the reaction. $H_2$ was turned off after 60 min of reaction. The substrate was cooled to 300° C. in an Ar and S atmosphere and S heating was stopped. Followed by continuously cooling to room temperature, and the sample was taken to obtain the continuously covered $WS_2$ single crystal wafer.

Example 5

Selenium powder (S), tungsten trioxide ($WO_3$) and a sapphire substrate (C plane, A direction inclined 1.5 degrees) were placed in the first, second and third temperature zones of the three-temperature zone CVD system, respectively. Vacuum was drawn below 10 Pa and 100 sccm Ar+10 sccm $H_2$ were introduced. The substrate was warmed to 900° C., then S was heated to 250° C. to melt, then $WO_3$ was warmed to 1050° C. to start the reaction. $H_2$ was turned off after 60 min of reaction. The substrate was cooled to 300° C. in an Ar and Se atmosphere and Se heating was stopped. Followed by continuously cooling to room temperature, and the sample was taken to obtain the continuously covered $WSe_2$ single crystal wafer.

Example 6

Selenium powder (S), molybdenum trioxide ($MoO_3$) and a sapphire substrate (C plane, A direction inclined 1.5 degrees) were placed in the first, second and third temperature zones of the three-temperature zone CVD system, respectively. Vacuum was drawn below 10 Pa and 100 sccm Ar+10 sccm $H_2$ were introduced. The substrate was warmed to 870° C., then Se was heated to 250° C. to melt, then $MoO_3$ was warmed to 530° C. to start the reaction. $H_2$ was turned off after 60 min of reaction. The substrate was cooled to 300° C. in an Ar and Se atmosphere and Se heating was stopped. Followed by continuously cooling to room temperature, and the sample was taken to obtain the continuously covered $MoSe_2$ single crystal wafer.

Example 7

Selenium powder (S), tungsten trioxide ($WO_3$) and a sapphire substrate (C plane, A direction inclined 1.0 degrees) were placed in the first, second and third temperature zones of the three-temperature zone CVD system, respectively. Vacuum was drawn below 10 Pa and 100 sccm Ar+5 sccm $H_2$ were introduced. The substrate was warmed to 850° C., then Se was heated to 250° C. to melt, then $WO_3$ was warmed to 870° C. to start the reaction. $H_2$ was turned off after 30 min of reaction. The substrate was cooled to 300° C. in an Ar and Se atmosphere and Se heating was stopped. Followed by continuously cooling to room temperature, and the sample was taken to obtain the unidirectional aligned $WSe_2$ domains.

Figure 12:
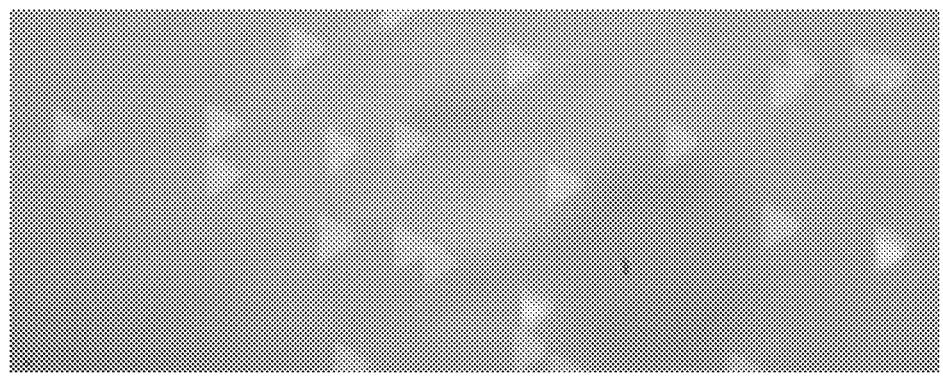
FIG. 12 is an optical photograph of the unidirectionally arranged $WSe_2$ domains obtained in Example 7.

FIG. 12 is an optical photograph of the unidirectionally arranged $WSe_2$ obtained in this example.

Figure 13:
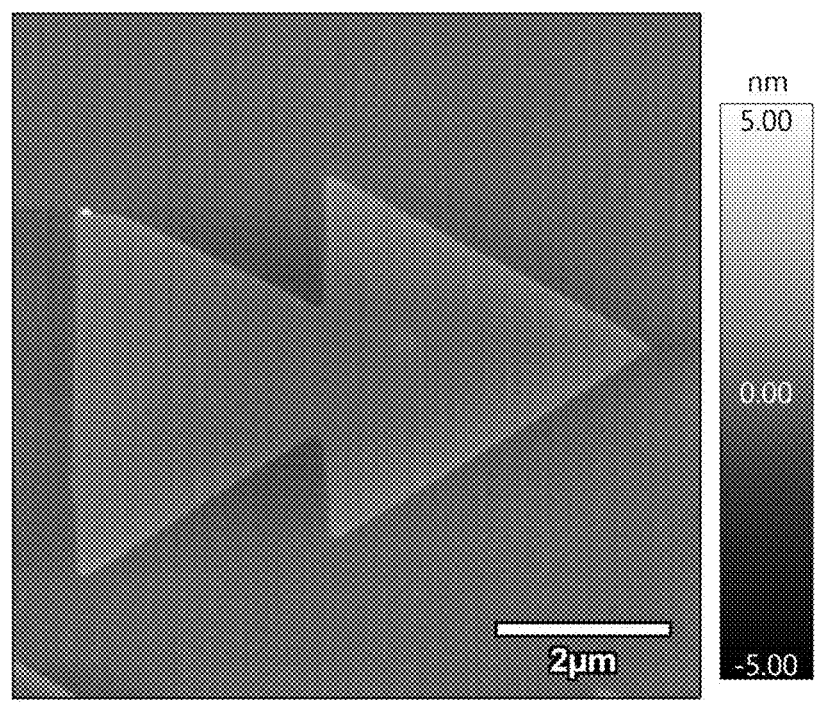
FIG. 13 is a corresponding atomic force microscope image of the unidirectional $WSe_2$ grown in Example 7. It can be seen that one of the $WSe_2$ edges parallels to the <10$\bar{1}$0> steps.

FIG. 13 is a corresponding atomic force microscope image. It can be seen that one of the $WSe_2$ edges parallel to the $<10\bar{1}0>$ steps.

Figure 14:
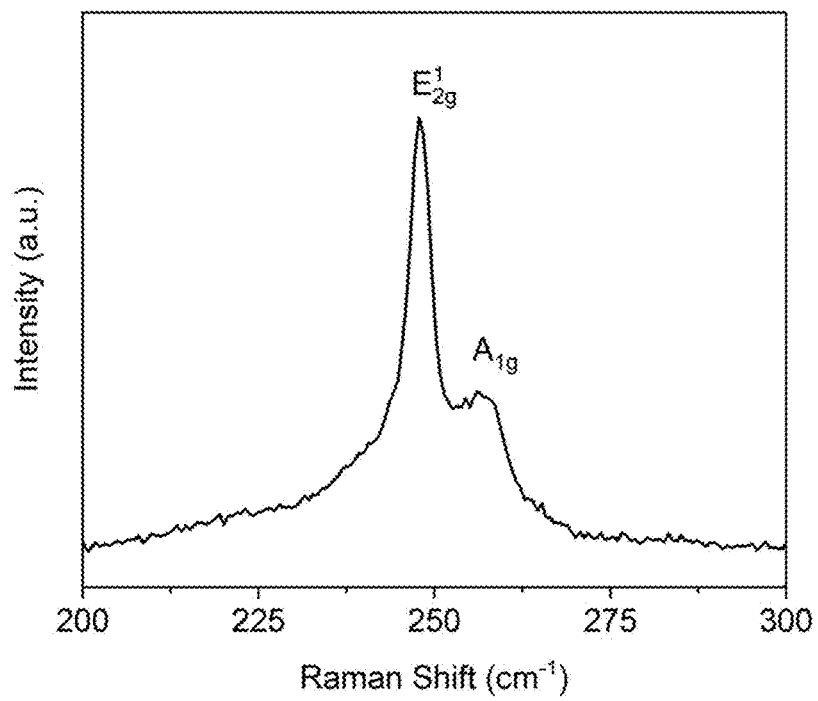
FIG. 14 is the Raman spectrum of the as-grown $WSe_2$ grown in Example 7.

FIG. 14 is the Raman spectrum of the as-grown $WSe_2$.

What is claimed is:

1. A method for preparing a transition metal dichalcogenide single-crystal films, characterized by comprising the steps of:
   (1) providing a single-crystal C-plane sapphire substrate with surface steps along $<10\bar{1}0>$ orientation of the substrate, wherein the $<10\bar{1}0>$ steps of the C-sapphire substrate are obtained by a major mis-cut towards $<11\bar{2}0>$ crystallographic axis during machining process; and a minor mis-cut angle towards $<10\bar{1}0>$ direction shall be less than 34.6% of the major mis-cut angle of the A-axis direction; and
   (2) taking the C-sapphire in step (1) as the substrate, generating unidirectionally arranged transition metal dichalcogenide domains on the surface of the substrate using a vapor deposition method and keeping the domains continuously grow and merge into a single-crystal film;
   wherein grains are aligned in an unidirectional manner and merged without gap between the grains into an entire single-crystal film up to length of two inch with grain boundary-free; the transition metal dichalcogenide is selected from the group consisting of molybdenum disulfide, tungsten disulfide, molybdenum diselenide and tungsten diselenide.

2. The method for preparing the transition metal dichalcogenide single-crystal films of claim 1, characterized in that in step (1), the surface atomic-level steps are oriented along the $<10\bar{1}0>$ direction of the C-sapphire substrate within an allowable angular deviation of ±19.1°.

3. The method for preparing the transition metal dichalcogenide single-crystal films of claim 1, characterized in that in step (2), the vapor deposition methods include chemical vapor deposition method, molecular beam epitaxy method, pulsed laser deposition method, or magnetron sputtering method.

4. The method for preparing the transition metal dichalcogenide single-crystal films of claim 3, characterized in that in step (2), the transition metal dichalcogenide crystals prepared by the chemical vapor deposition method comprising: placing the sapphire in a vapor deposition chamber, loading the growth sources, setting a growth condition, and generating unidirectionally arranged transition metal dichalcogenide domains on the sapphire surface; and continuously introducing the growth sources to allow the transition metal dichalcogenide domains to gradually grow and merge into a transition metal dichalcogenide single-crystal film.

* * * * *